United States Patent
Ohnishi et al.

(10) Patent No.: US 7,453,695 B2
(45) Date of Patent: Nov. 18, 2008

(54) COOLING STRUCTURE OF ELECTRIC DEVICE

(75) Inventors: Kenichi Ohnishi, Toyota (JP); Koshi Torii, Iwakura (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 361 days.

(21) Appl. No.: 10/556,586

(22) PCT Filed: Nov. 9, 2004

(86) PCT No.: PCT/IB2004/003659

§ 371 (c)(1),
(2), (4) Date: Nov. 14, 2005

(87) PCT Pub. No.: WO2005/051063

PCT Pub. Date: Jun. 2, 2005

(65) Prior Publication Data

US 2006/0291261 A1    Dec. 28, 2006

(30) Foreign Application Priority Data

Nov. 18, 2003   (JP)   .............................. 2003-388069

(51) Int. Cl.
*H05K 7/20* (2006.01)
*F28D 15/00* (2006.01)

(52) U.S. Cl. .................. 361/689; 361/699; 361/700; 361/703; 361/704; 165/80.4; 165/104.33; 363/141

(58) Field of Classification Search ......... 361/699–703; 165/80.4, 80.5, 104.33; 62/259.2; 363/141
See application file for complete search history.

(56) References Cited

U.S. PATENT DOCUMENTS

| | | | | |
|---|---|---|---|---|
| 4,938,280 A | * | 7/1990 | Clark | 165/80.4 |
| 5,111,280 A | * | 5/1992 | Iversen | 257/713 |
| 5,218,516 A | * | 6/1993 | Collins et al. | 361/721 |
| 5,313,361 A | * | 5/1994 | Martin | 361/699 |
| 5,631,821 A | * | 5/1997 | Muso | 363/141 |
| 5,740,015 A | * | 4/1998 | Donegan et al. | 361/699 |
| 5,923,085 A | * | 7/1999 | Donegan et al. | 257/712 |
| 6,076,596 A | * | 6/2000 | Osakabe et al. | 165/104.33 |
| 6,158,232 A | * | 12/2000 | Tsuji et al. | 62/259.2 |
| 6,166,937 A | | 12/2000 | Yamamura et al. | |
| 6,236,566 B1 | * | 5/2001 | Regnier et al. | 361/699 |
| 6,357,517 B1 | * | 3/2002 | Osakabe et al. | 165/104.33 |
| 6,819,561 B2 | * | 11/2004 | Hartzell et al. | 361/689 |
| 6,865,080 B2 | * | 3/2005 | Radosevich et al. | 361/699 |
| 6,898,072 B2 | * | 5/2005 | Beihoff et al. | 361/676 |
| 6,909,607 B2 | * | 6/2005 | Radosevich et al. | 361/699 |

(Continued)

FOREIGN PATENT DOCUMENTS

EP    0 688 053 A1    12/1995

(Continued)

*Primary Examiner*—Jayprakash N Gandhi
*Assistant Examiner*—Robert J Hoffberg
(74) *Attorney, Agent, or Firm*—Kenyon & Kenyon LLP

(57) ABSTRACT

A cooling structure of electric devices in a vehicle is structured to hold an inverter (300) downward of a cooling passage (356), and to hold a condenser (200) upward of the cooling passage (356). The heating value generated by the inverter (300) is larger than the heating value generated by the condenser (200).

11 Claims, 4 Drawing Sheets

U.S. PATENT DOCUMENTS

| | | | | |
|---|---|---|---|---|
| 6,940,715 B2 * | 9/2005 | Beihoff et al. | ............... | 361/689 |
| 6,965,514 B2 * | 11/2005 | Beihoff et al. | ............... | 361/699 |
| 6,972,957 B2 * | 12/2005 | Beihoff et al. | ............... | 361/698 |
| 6,982,873 B2 * | 1/2006 | Meyer et al. | ................ | 361/699 |
| 7,004,239 B2 * | 2/2006 | Osakabe et al. | ........ | 165/104.21 |
| 7,016,192 B2 * | 3/2006 | Beihoff et al. | ............... | 361/689 |
| 7,032,695 B2 * | 4/2006 | Beihoff et al. | ............. | 180/65.1 |
| 7,061,775 B2 * | 6/2006 | Beihoff et al. | ............... | 361/818 |
| 7,095,612 B2 * | 8/2006 | Beihoff et al. | ............... | 361/696 |
| 7,114,550 B2 * | 10/2006 | Nakahama et al. | ......... | 165/80.4 |
| 7,142,434 B2 * | 11/2006 | Beihoff et al. | ............... | 361/818 |
| 7,177,153 B2 * | 2/2007 | Radosevich et al. | ......... | 361/699 |
| 7,187,548 B2 * | 3/2007 | Meyer et al. | ................ | 361/699 |
| 7,187,568 B2 * | 3/2007 | Radosevich et al. | ......... | 363/144 |
| 7,212,407 B2 * | 5/2007 | Beihoff et al. | ............... | 361/699 |

FOREIGN PATENT DOCUMENTS

| | | |
|---|---|---|
| JP | A 10-50909 | 2/1998 |
| JP | 10-256445 A | 9/1998 |

* cited by examiner

COOLING STRUCTURE OF ELECTRIC DEVICE

This is a 371 national phase application of PCT/IB2004/003659 filed 9 Nov. 2004, claiming priority to Japanese Patent Application No. 2003-388069 filed 18 Nov. 2003, the contents of which are incorporated herein by reference.

INCORPORATION BY REFERENCE

The disclosure of Japanese Patent Application No. 2003-388069 filed on Nov. 18, 2003 including the specification, drawings and abstract is incorporated herein by reference in its entirety.

BACKGROUND OF THE INVENTION

1. Field of Invention

The invention relates to a cooling structure of an electric device, and more particularly, to a cooling structure of a plurality of electric devices.

2. Description of Related Art

Coping with recent environmental issues, development of hybrid vehicles using driving force of the motor, fuel cell vehicles, electric vehicles and the like have been increasingly focused. The vehicle of the aforementioned type is generally equipped with a PCU (Power Control Unit) that regulates electric power supplied from the driving battery (at about 300 V, for example) into a desired state so as to be supplied to the motor. The PCU includes such electric devices as an inverter, a filter condenser, and a converter. As those electric devices generate heat upon supply of electricity, they have to be cooled by circulating cooling medium or cooling water therearound.

JP-A-2001-245478 discloses a cooling system of an inverter, which has a high cooling capacity as well as high productivity. The aforementioned cooling system serves to cool the inverter including a high temperature portion in which a unit that generates larger heating value is placed and a low temperature portion in which a unit that generates lower heating value is placed. The cooling system has cooling medium passages for the high temperature portion and the low temperature portion, respectively each of which has a different structure.

As the structure of the cooling medium passage for the high temperature portion of the inverter is different from that for the low temperature portion, the cooling level may be changed depending on the temperature distribution on the inverter. Accordingly, the productivity of the cooling system for the inverter may be improved while keeping the cooling capability.

As the cooling system of the inverter disclosed in the aforementioned publication has cooling medium passages each having different structure for the high temperature portion and the low temperature portion, respectively, the resultant size of the system has to be enlarged.

SUMMARY OF THE INVENTION

It is an object of the invention to provide a cooling structure of an electric device, which is capable of cooling a plurality of electric devices effectively while reducing its size.

According to the invention, a cooling structure of electric devices including a first electric device that includes one or more first heater elements, all of the one or more first heater elements being disposed only on one side of a cooling passage; and a second electric device that includes one or more second heater elements, all of the one or more second heater elements being disposed only on another side of the cooling passage is provided in a vehicle for cooling the first and the second electric devices. In the cooling structure, each of the first and the second electric devices includes a heater element, and the first electric device generates a heating value that is larger than a heating value generated by the second electric device. The cooling structure is further provided with a cooling passage that allows a cooling medium to flow therethrough so as to cool the first electric device and the second electric device, a first holding member that holds the first electric device so as to be disposed downward of the cooling passage, and a second holding member that holds the second electric device so as to be disposed upward of the cooling passage.

In the aforementioned invention, the cooling medium is circulated for cooling the first and the second electric devices. The first holding member holds the first electric device so as to be positioned downward of the cooling passage. The second holding member holds the second electric device so as to be positioned upward of the cooling passage. As a result, the single cooling passage may be provided for cooling those first and the second electric devices with the cooling medium that flows therethrough. Accordingly there is no need of providing the cooling passages independently for the first electric device and the second electric device. The first electric device that generates larger heating value than that of the second electric device is disposed downward of the cooling passage. Meanwhile the second electric device that generates smaller heating value than that of the first electric device is held upward of the cooling passage. In the case where the cooling medium evaporates to generate bubbles, those bubbles move upward of the cooling passage. Accordingly, bubbles are hardly generated around the first electric device that needs to be cooled more than the second electric device. Even if the bubbles gather around the second electric device that generates smaller heating value than that of the first electric device, they hardly influence the performance of the second electric device. The cooling structure is capable of effectively cooling a plurality of electric devices while reducing its size.

In the cooling structure according to the invention, the first holding member has a recess portion that is formed in an upper surface thereof and includes an opening directed upward so as to allow the cooling medium to flow thereinto, and the second holding member includes a fixture portion that allows the second holding member to be fixed to the first holding member so that the recess portion is covered from above.

In the aforementioned invention, the recess portion formed in the upper surface of the first holding member allows the cooling medium to flow thereinto. The second holding member seals the recess portion from above. The cooling passage may be defined by the first and the second holding members. As the cooling medium becomes directly in contact with the first and the second holding members, the heat may be efficiently absorbed by the cooling medium.

In the cooling structure according to the invention, the first holding member includes a plurality of cooling fins each projecting upward from a bottom surface of the recess portion.

In the aforementioned invention, a plurality of cooling fins project upward from the bottom of the recess portions. This may increase the area of the first holding member in contact with the cooling medium by the amount corresponding to the number of the cooling fins. Accordingly, the heat may be efficiently absorbed by the cooling medium.

In the cooling structure according to the invention, the first electric device is formed as an inverter, and the second electric device is formed as at least one of a condenser and a converter. In the cooling structure, the first holding member is formed as a member that holds the inverter so as to be disposed downward of the cooling passage, and the second holding member is formed as a member that holds the at least one of the condenser and the converter so as to be disposed upward of the cooling passage.

In the aforementioned invention, the first electric device is formed as the inverter. In the case where the vehicle is equipped with a driving battery and a three-phase motor, the inverter serves to convert the electric current supplied from the driving battery from direct current into alternating current so as to be supplied to the three-phase motor. In order to drive the three-phase motor, that is, start the vehicle, the inverter is always operated. The second electric device may be formed as at least one of the condenser and the converter. The condenser functions in storing electric charge temporarily for smoothing. Generally, the heating value of the condenser is smaller than that of the inverter. Meanwhile the converter functions in boosting the electric power supplied from the driving battery to be supplied to the three-phase motor so as to be driven at a desired output in response to the vehicle running state or the acceleration request from the vehicle operator. There may be a case that the converter has not been operated even if the three-phase motor is driven. The heating value of the converter, thus, is smaller than that of the inverter. The aforementioned inverter is held downward of the cooling passage, and at least one of the condenser and the converter is held upward of the cooling passage. The above arrangement makes it possible to cool the inverter and at least one of the condenser and the converter efficiently.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF PREFERRED EMBODIMENTS

Figure 1:
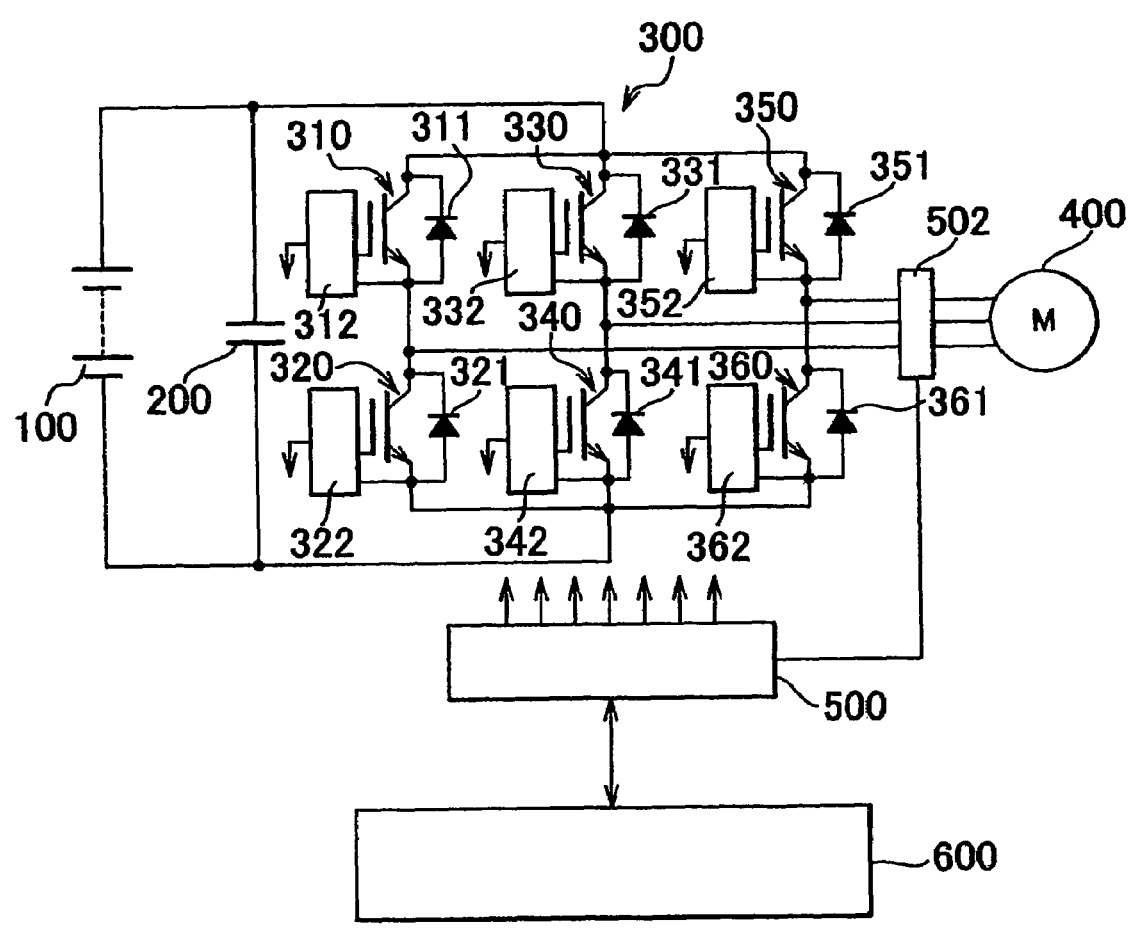
FIG. 1 is a circuit diagram of a PCU according to an embodiment 1 of the invention.

Embodiments of the invention will be described referring to the drawings. In those embodiments, the identical elements having the same descriptions and functions are designated with identical reference numerals, and explanations of those elements, thus, will be omitted.

Embodiment 1

Referring to FIG. 1, a vehicle equipped with a cooling structure of a PCU having electric devices according to an embodiment 1 includes a driving battery 100, a filter condenser 200, an inverter 300, a driving motor 400, a signal generation circuit 500, and a control circuit 600.

The driving battery 100 is a combination battery formed by connecting a plurality of battery modules each formed of a plurality of cells connected in series. The driving battery 100 has a voltage value of, for example, about 300 V.

The filter condenser 200 is connected in parallel with the driving battery 100. The filter condenser 200 temporarily stores the electric charge to smooth the electric power supplied from the driving battery 100. The electric power smoothed by the filter condenser 200 is supplied to the inverter 300.

The inverter 300 includes six IGBTs (Insulated Gate Bipolar Transistor) 310 to 360, six diodes 311 to 361 each connected in parallel with the respective IGBT so as to apply electric current from the emitter side to the collector side of the IGBT, and six IGBT drive circuits 312 to 362 each connected to the respective IGBT so as to be driven in accordance with the signal generated by the signal generation circuit 500. The IGBT 310 and IGBT 320, IGBT 330 and IGBT 340, and IGBT 350 and IGBT 360 are connected in series, respectively so as to correspond with the respective phases (U phase, V phase, W phase). The inverter 300 serves to convert the electric current supplied from the driving battery 100 from the alternating current into the direct current so as to be supplied to the driving motor 400 in response to switching of the respective IGBTs between On and Off. As the inverter 300 may be formed using general technology, no further explanation with respect to the inverter will be described.

The driving motor 400 is a three-phase motor having a rotating shaft connected to a drive shaft (not shown) of the vehicle. The vehicle is started by the driving force supplied from the driving motor 400.

Upon operation of the driving motor 400, that is, start of the vehicle, the inverter 300 has to be always operated. During operation of the inverter 300, each of six IGBTs is repeatedly switched between On and Off, thus generating a large heating value. Meanwhile, although the condenser 200 repeatedly performs storage and discharge of the electric charge, the resultant heating value is generally smaller than that of the inverter 300.

The signal generation circuit 500 is controlled by the control circuit 600 such that the signal that commands On/Off of the IGBTs is generated. The control circuit 600 calculates an On/Off ratio (duty ratio) of the respective IGBTs based on a depression amount of an accelerator pedal (not shown), an opening degree of a throttle valve (not shown) and the like. As the signal generation circuit 500 and the control circuit 600 may be formed using general technology, no further explanation of those components will be described.

Figure 2:
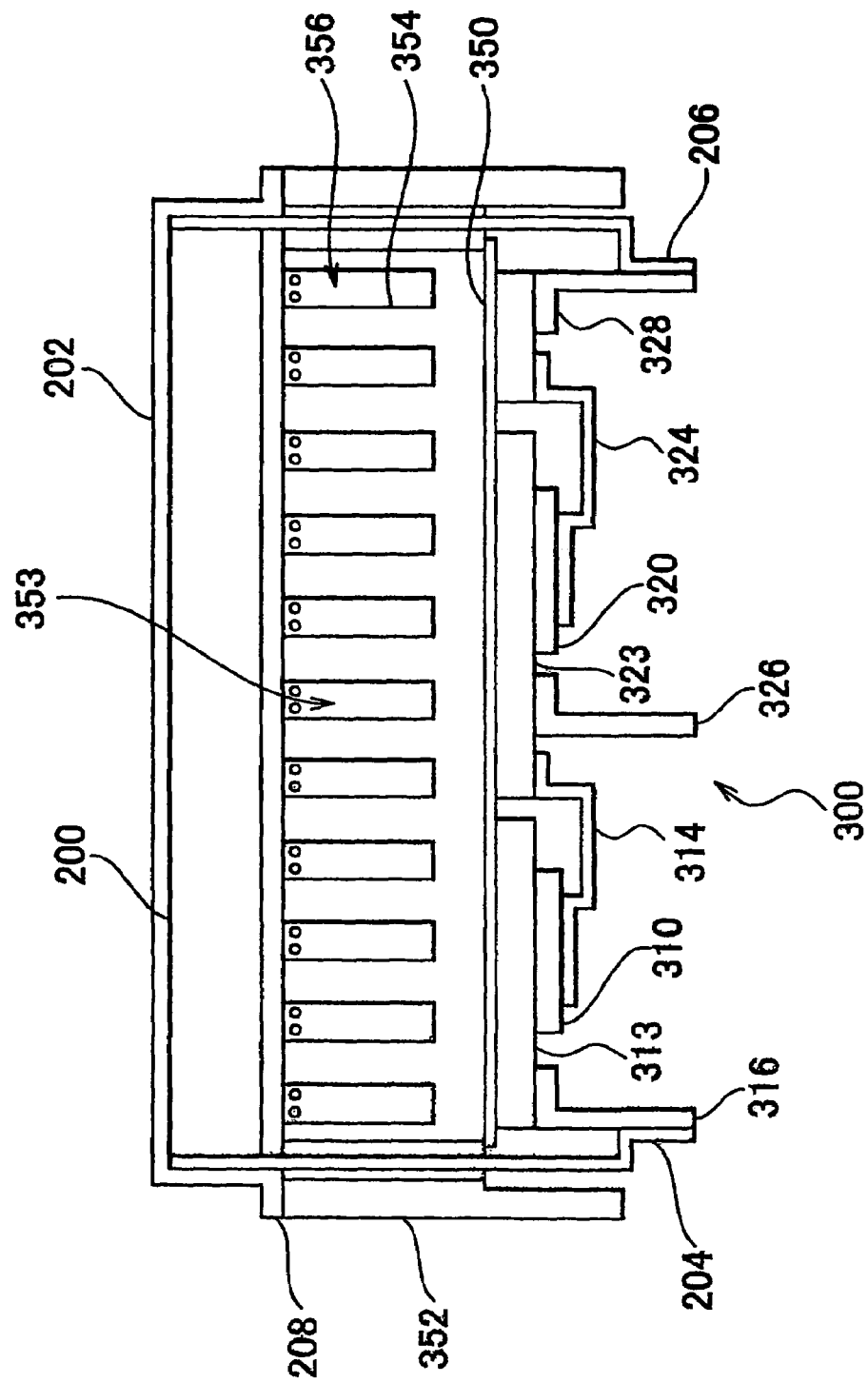
FIG. 2 is a sectional view of the PCU according to the embodiment 1 of the invention.

A structure of the PCU according to this embodiment will be described referring to FIG. 2 representing a sectional view of the PCU.

The condenser 200 is held in a condenser case 202. A positive electrode and a negative electrode of the condenser 200 are connected to the inverter 300 via a positive electrode bus bar 204 and a negative electrode bus bar 206, respectively. The condenser case 202 includes a flange portion 208 formed along an outer periphery of the condenser case 202. The flange portion 208 has a plurality of bolt holes (not shown) for insertion of bolts.

The inverter 300 is held on the lower surface of an inverter case 352 via an insulating sheet 350. The structure of attachment of the inverter 300 will be described in detail using the IGBT 310 and IGBT 320 as an example.

The IGBT 310 is attached to the lower surface of a flat plate collector side electrode 313. The collector side electrode 313 is attached to the lower surface of the inverter case 352 via the insulating sheet 350. A positive electrode terminal 316 connected to the positive electrode bus bar 204 is attached to the collector side electrode 313.

The IGBT 320 is attached to the lower surface of a flat plate collector side electrode 323. The collector side electrode 323 is attached to the lower surface of the inverter case 352 via the insulating sheet 350. The collector side electrode 323 is connected to the IGBT 310 via an emitter side (emitter of the IGBT 310) electrode 314. An output terminal 326 to the driving motor 400 is connected to the collector side electrode 323. The IGBT 320 is connected to the negative electrode bus bar 206 via the emitter side (emitter of the IGBT 320) electrode 324 and a negative electrode terminal 328.

Likewise the IGBTs 310 and 320, the IGBTs 330 and 340, and the IGBTs 350 and 360 are attached to the lower surface of the inverter case 352. Accordingly no further description of attachment of those elements will be described.

The inverter case 352 includes recess portions 353 each having an opening directed upward, and a plurality of cooling fins 354 each projecting upward from the bottom surface of the recess portion 353. The opening of the recess portion 353 is coverd with the lower surface of the condenser case 202. A bolt is inserted into the bolt hole formed in the flange portion 208 of the condenser case 202 so as to be held in the inverter case 352 by screwing the bolt in the bolt hole. Then the condenser case 202 is fixed to the inverter case 352. The condenser case 202 may be fixed to the inverter case 352 with an arbitrary fixing process other than the use of the bolt.

The space defined by the inverter case 352, the cooling fins 354, and the condenser case 202 allows the cooling water to flow therethrough. That is, a cooling passage 356 is defined by the inverter case 352, the cooling fins 354, and the condenser case 202. The cooling water enters from an inlet (not shown) formed in the inverter case 352 to flow into the cooling passage 356, and then flows out of an outlet (not shown) formed in the inverter case 352. An arbitrary cooling medium other than the cooling water may be employed to be circulated through the cooling passage.

Functions of the above structured PCU according to the embodiment will be described hereinafter.

The cooling water that circulates through the cooling passage 356 serves to absorb heat generated in the condenser 200 and the inverter 300. As the inverter case 352 is provided with a plurality of cooling fins 354, the area of the contact between the inverter case 352 and the cooling water is increased by the amount corresponding to the number of the cooling fins 354. This makes it possible to improve the heat transfer efficiency. Further cooling water come into contact with the converter case 200 and the inverter case 352 directly. This makes it possible to improve the heat transfer efficiency. Accordingly there is no need of increasing the surface area of the condenser 200 so as to enhance the discharging capability of the condenser 200 by itself. This may reduce the size of the condenser 200. There is no need of forming different cooling passages for cooling the condenser 200 and the inverter 300, that is, the identical cooling passage 356 may be used for cooling those electric devices, resulting in simplified structure of the PCU with reduced size.

When the temperature of the heat absorbing cooling water increases to reach a boiling point, the cooling water boils. Then bubbles are generated owing to vapor released from the boiling cooling water. As a specific gravity of the vapor is smaller than that of the cooling water, the bubbles will be accumulated in an upper part of the cooling passage 356. As the inverter 300 that generates a larger heating value than that of the condenser 200 is held downward of the cooling passage, the bubbles may be removed from the area around the inverter 300. Therefore, the area around the inverter 300 is always filled with the cooling water. The influence of those bubbles to the inverter 300, thus, may be suppressed such that the cooling performance thereof is not deteriorated.

As the bubbles gather around the condenser 200, the cooling performance of the condenser 200 may be deteriorated. However, as the heating value of the condenser 200 is smaller than that of the inverter 300, the influence of those bubbles to the cooling performance of the condenser 200 may be negligible.

The PCU according to the embodiment has the inverter disposed downward of the cooling passage, and the condenser disposed upward of the cooling passage. In the embodiment, the single cooling passage is employed for cooling both the inverter that generates the relatively larger heating value and the condenser that generates the relatively smaller heating value. There is no need of providing different cooling passages for the inverter and the condenser, independently, thus simplifying the structure of the PCU while reducing its size.

In the PCU, the inverter that generates the relatively larger heating value is held downward of the cooling passage, and the condenser that generates the relatively smaller heating value is held upward of the cooling passage. Even when the cooling water evaporates to generate bubbles, the aforementioned arrangement serves to remove those bubbles from the area around the inverter. This may suppress the influence of the bubbles to the cooling performance of the inverter, thus preventing deterioration in the cooling performance of the inverter. Meanwhile, the bubbles gather around the condenser to deteriorate its cooling performance. As the heating value of the condenser is smaller than that of the inverter, the influence of those bubbles to the cooling performance of the condenser is negligible. This makes it possible to efficiently cool the inverter and the condenser while suppressing the influence of the bubbles to those electric devices.

Embodiment 2

An explanation with respect to a PCU having a cooling structure of electric devices according to an embodiment 2 will be described referring to FIG. 3. The PCU according to the embodiment includes a converter 700 held upward of the cooling passage 356 in place of the condenser 200 as described in the embodiment 1. Other structures and functions of this embodiment are the same as those of the embodiment 1. Accordingly no further detailed explanation of those structures and functions will be described herein.

Figure 3:
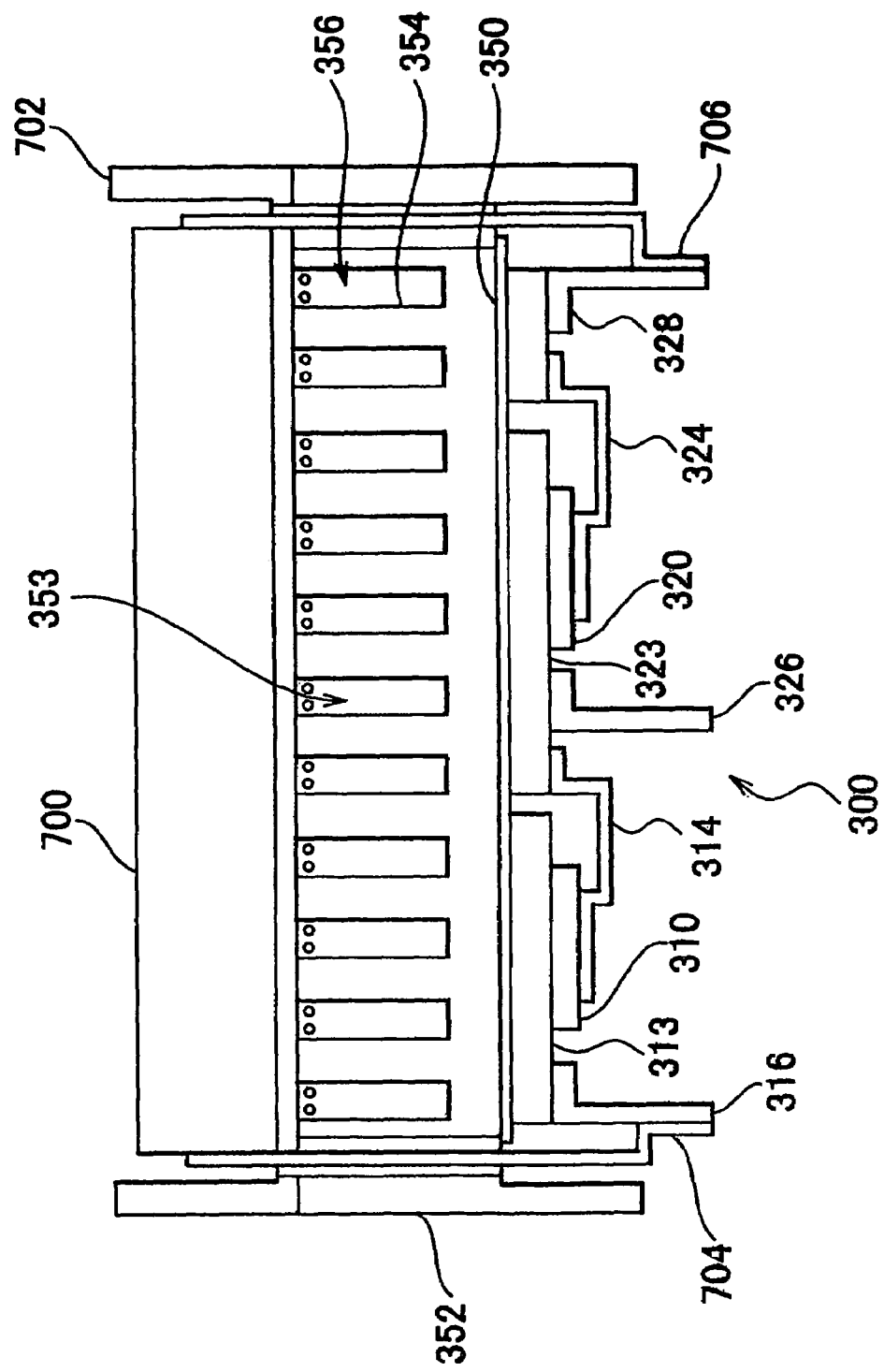
FIG. 3 is a sectional view of the PCU according to an embodiment 2 of the invention.

FIG. 3 is a sectional view of the PCU according to this embodiment. The converter 700 is held in a converter case 702. A positive electrode of the converter 700 is connected to the positive electrode terminal 316 of the inverter 300 via a positive electrode bus bar 704. A negative electrode of the converter 700 is connected to the negative electrode terminal 328 via a negative electrode bus bar 706.

An opening of the recess portion 353 is coverd with the lower surface of the converter case 702. The space defined by the inverter case 352, cooling fins 354 and the converter case 702 allows the cooling water to flow therethrough. That is, the cooling passage 356 is defined by the inverter case 352, cooling fins 354 and the converter case 702.

The converter 700 boosts the voltage value of the electric power supplied from the driving battery 100 so as to be supplied to the inverter 300. The converter 700 is controlled by the control circuit 600. The control circuit 600 controls such that the converter 700 boosts the voltage based on the amount of depression of the accelerator pedal (not shown), opening degree of the throttle valve, vehicle speed and the like so as to drive the driving motor 400 at required torque and engine speed. There may be the case where the converter 700 has not been operated even if the driving motor 400 is driven. Accordingly the heating value of the converter 700 is smaller than that of the inverter 300.

The above-described structure of the PCU provides the same effects as those obtained from the embodiment 1 as aforementioned.

Embodiment 3

An explanation with respect to a PCU with a cooling structure of electric devices according to an embodiment 3 will be described referring to FIG. 4. In the PCU of the embodiment according to the invention, the condenser 200 in the embodiment 1 is not held upward of the cooling passage 356, but a seal plate 800 serves to seal the opening of the recess portion 353. Other structures and functions of this embodiment are the same as those of the embodiment 1. Accordingly no further detailed explanation of those structures and functions will be described herein.

Figure 4:
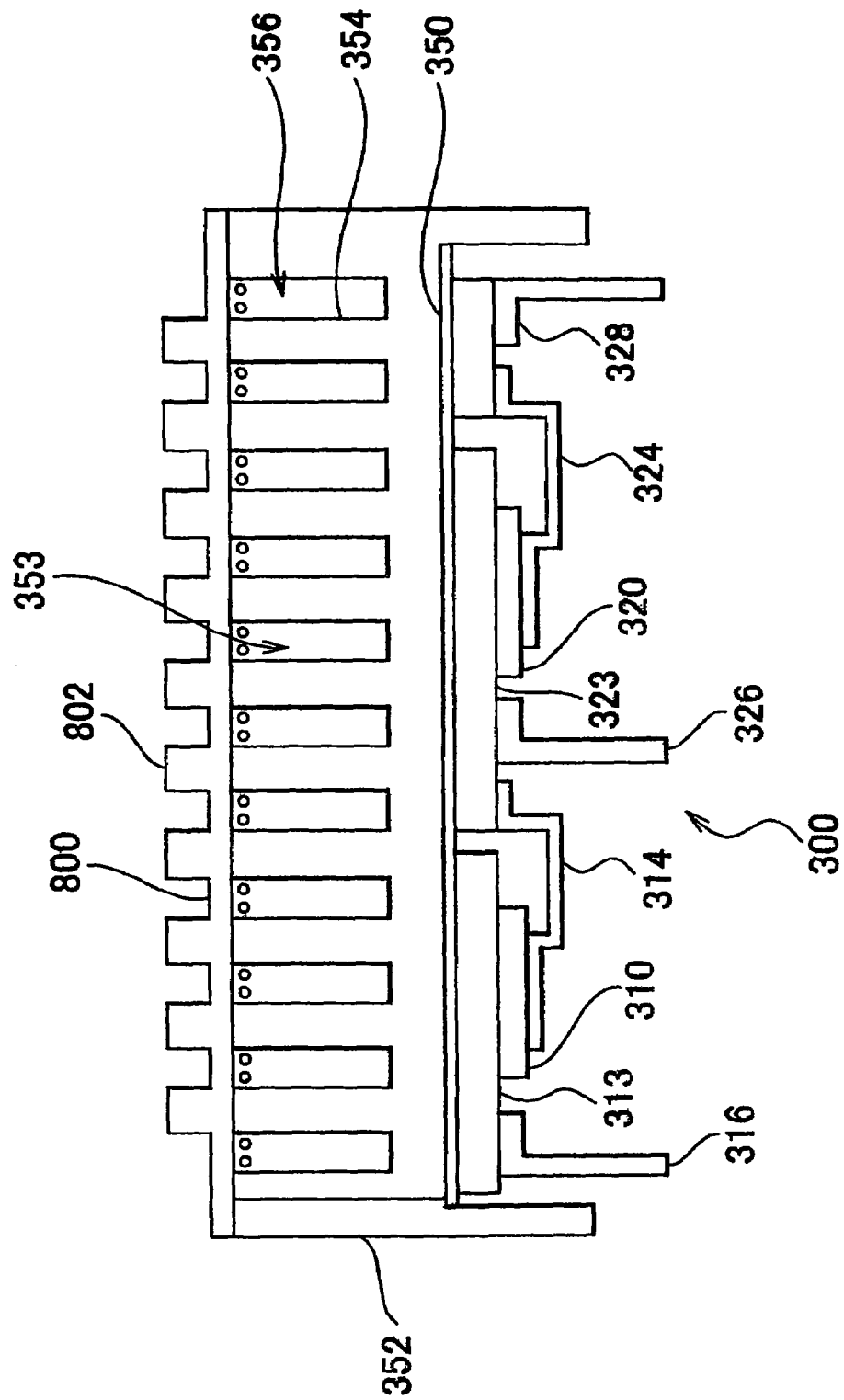
FIG. 4 is a sectional view of the PCU according to an embodiment 3 of the invention.

FIG. 4 is a sectional view of the PCU according to the embodiment 3. The seal plate 800 includes a plurality of projections 802 formed on the upper surface of the seal plate 800. The opening of the recess portion 353 is covered with the lower surface of the seal plate 800. The space defined by the inverter case 352, cooling fins 354, and the seal plate 800 allows the cooling water to flow therethrough. That is, the cooling passage 356 is defined by the inverter case 352, the cooling fins 354, and the seal plate 800.

The function of the above-structured PCU according to this embodiment will be described.

The cooling water that passes through the cooling passage 356 absorbs heat generated in the inverter 300. The heat absorbed by the cooling water is discharged from the PCU via the seal plate 800. As a plurality of projections 802 are formed on the seal plate 800, the area of contact between the seal plate 800 and outside air is increased by the amount corresponding to the number of the projections 802. As a result, the heat release performance of the seal plate 800 is improved.

When the temperature of the heat absorbing cooling water increases to reach a boiling point, the cooling water boils. When the cooling water is boiled, bubbles are generated owing to vapor released from the cooling water. As the specific gravity of the vapor is smaller than that of the cooling water, those bubbles are accumulated at the upper part of the cooling passage 356. As the inverter 300 is held downward of the cooling passage 356, the bubbles may be removed from the area around the inverter 300. Accordingly the area around the inverter 300 may be constantly filled with the cooling water. The influence of the bubbles to the inverter 300 may be suppressed, and therefore, deterioration in the cooling performance of the inverter 300 may be prevented.

In the PCU according to the embodiment, a plurality of projections are formed on the upper surface of the seal plate. This makes it possible to discharge the heat released from the inverter to outside rapidly.

All the embodiments of the invention are not limited to the above-described structures represented as examples. The invention may not be indicated by the explanation but in claims, which contains all modifications within the scope of the invention.

The invention claimed is:

1. A cooling structure of electric devices, comprising:
   a first electric device that includes one or more first heater elements, all of the one or more first heater elements being disposed only on one side of a cooling passage;
   a second electric device that includes one or more second hater elements, all of the one or more second heater elements being disposed only on another side of the cooling passage and the second electric device generates a heating value that is smaller than a heating value generated by the first electric device;
   a cooling passage that allows a cooling medium to flow therethrough so as to cool the first electric device and the second electric device;
   a first holding member that holds the first electric device so as to be disposed downward of the cooling passage; and
   a second holding member that holds the second electric device so as to be disposed upward of the cooling passage,
   wherein the first electric device is an inverter.

2. The cooling structure according to claim 1, wherein the first holding member has a recess portion that is formed in an upper surface of the first holding member and includes an opening directed upward so as to allow the cooling medium to flow thereinto, and the second holding member includes a fixture portion that allows the second holding member to be fixed to the first holding member so that the recess portion is covered from above.

3. The cooling structure according to claim 2, wherein the first holding member comprises a plurality of cooling fins each projecting upward from a bottom surface of the recess portion.

4. The cooling structure according to claim 3, wherein the second electric device is at least one of a condenser and a converter; the first holding member is a member that holds the inverter so as to be disposed downward of the cooling passage; and the second holding member is a member that holds the at least one of the condenser and the converter so as to be disposed upward of the cooling passage.

5. The cooling structure according to claim 2, wherein the second electric device is at least one of a condenser and a converter; the first holding member is a member that holds the inverter so as to be disposed downward of the cooling passage; and the second holding member is a member that holds the at least one of the condenser and the converter so as to be disposed upward of the cooling passage.

6. The cooling structure according to claim 1, wherein the second electric device is at least one of a condenser and a converter; the first holding member is a member that holds the inverter so as to be disposed downward of the cooling passage; and the second holding member is a member that holds the at least one of the condenser and the converter so as to be disposed upward of the cooling passage.

7. The cooling structure according to claim 1, wherein at least one bus bar connects the first and second electrical devices.

8. The cooling structure according to claim 1, wherein positive and negative bus bars connect the first and second electrical devices.

9. A cooling structure of electric devices, comprising:
   a first electric device that includes one or more heater elements, all of the one or more first heater elements, all of the one or more first heater elements being disposed only on one side of a cooling passage;
   a second electric device that includes one or more heater elements, all of the one or more of the second heater elements, all of the one or more second heater elements being disposed only on another side of the cooling passage and the second electric device generates a heating value that is smaller than a heating value generated by the first electric device;

a cooling passage that allows a cooling medium to flow therethrough so as to cool the first electric device and the second electric device;

a first holding member that holds the first electric device so as to be disposed downward of the cooling passage; and a second holding member that holds the second electric device so as to be disposed upward of the cooling passage, wherein the first electric device is an inverter and bubbles generated in the cooling passage gather around the second electric device.

10. A cooling structure of electric devices, comprising:

a first electric device that includes one or more heater elements, all of the one or more first heater elements, all of the one or more first heater elements being disposed only on one side of a cooling passage;

a second electric device that includes one or more heater elements, all of the one or more second heater elements, all of the one or more second heater elements being disposed only on another side of the cooling passage and the second electric device generates a heating value that is smaller than a heating value generated by the first electric device;

a cooling passage that allows a cooling medium to flow therethrough so as to cool the first electric device and the second electric device;

a first holding member that holds the first electric device so as to be disposed downward of the cooling passage; and a second holding member that holds the second electric device so as to be disposed upward of the cooling passage, wherein the first electric device is an inverter and only the inverter is disposed downward of the cooling passage.

11. The cooling structure according to claim 1, wherein the first electric device and the second electric device are provided in a vehicle which uses a motor as a driving force.

* * * * *

UNITED STATES PATENT AND TRADEMARK OFFICE
CERTIFICATE OF CORRECTION

PATENT NO.         : 7,453,695 B2  
APPLICATION NO.  : 10/556586  
DATED                  : November 18, 2008  
INVENTOR(S)         : Kenichi Ohnishi et al.

Page 1 of 1

It is certified that error appears in the above-identified patent and that said Letters Patent is hereby corrected as shown below:

| Column | Line | |
|--------|------|---|
| 8 | 7 | Change "hater" to --heater--. |
| 8 | 61 | After "one or more" insert --first--. |
| 8 | 62 | Delete "elements, all". |
| 8 | 63 | Delete "of the one or more first heater". |
| 8 | 65 | After "one or more" insert --second--. |
| 8 | 66 | Delete entire line. |
| 9 | 18 | After "one or more" insert --first--. |
| 9 | 19 | Delete "all of the one or more first heater elements,". |
| 10 | 1 | After "one or more" insert --second--. |
| 10 | 2 | Delete "all of the one or more second heater elements,". |

Signed and Sealed this

Twenty-eighth Day of July, 2009

JOHN DOLL  
*Acting Director of the United States Patent and Trademark Office*